(12) United States Patent
Chang et al.

(10) Patent No.: US 10,522,635 B2
(45) Date of Patent: Dec. 31, 2019

(54) SEMICONDUCTOR DEVICE AND METHOD

(71) Applicant: Taiwan Semiconductor Manufacturing Company, Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/050,939

(22) Filed: Jul. 31, 2018

(65) Prior Publication Data

US 2018/0366550 A1 Dec. 20, 2018

Related U.S. Application Data

(62) Division of application No. 15/394,203, filed on Dec. 29, 2016.

(60) Provisional application No. 62/405,726, filed on Oct. 7, 2016, provisional application No. 62/370,591, filed on Aug. 3, 2016.

(51) Int. Cl.
| | |
|---|---|
| *H01L 29/36* | (2006.01) |
| *H01L 29/417* | (2006.01) |
| *H01L 29/78* | (2006.01) |
| *H01L 29/66* | (2006.01) |
| *H01L 21/265* | (2006.01) |
| *H01L 21/324* | (2006.01) |
| *H01L 21/768* | (2006.01) |

(52) U.S. Cl.
CPC ...... *H01L 29/41791* (2013.01); *H01L 21/265* (2013.01); *H01L 21/324* (2013.01); *H01L 21/76897* (2013.01); *H01L 29/6653* (2013.01); *H01L 29/66795* (2013.01); *H01L 29/785* (2013.01); *H01L 29/66545* (2013.01); *H01L 29/7848* (2013.01)

(58) Field of Classification Search
CPC ............... H01L 27/105; H01L 29/0843; H01L 29/0847; H01L 29/36
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |

(Continued)

FOREIGN PATENT DOCUMENTS

| | | |
|---|---|---|
| CN | 103545176 A | 1/2014 |
| TW | 201530772 A | 8/2015 |

*Primary Examiner* — Jae Lee
(74) *Attorney, Agent, or Firm* — Slater Matsil, LLP

(57) ABSTRACT

A semiconductor device and method of manufacture are provided. A source/drain region is formed next to a spacer, which is adjacent to a gate electrode. An implantation is performed through an implantation mask into the source/drain region as well as the first spacer, forming an implantation region within the spacer.

20 Claims, 9 Drawing Sheets

(56) References Cited

U.S. PATENT DOCUMENTS

| | | |
|---|---|---|
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,105,570 B2 | 8/2015 | Su et al. |
| 9,773,696 B2 | 9/2017 | Chang |
| 2005/0093032 A1 | 5/2005 | Liu et al. |
| 2005/0095793 A1 | 5/2005 | Lee |
| 2014/0001574 A1 | 1/2014 | Chen et al. |
| 2014/0042502 A1 | 2/2014 | Xie et al. |
| 2014/0110755 A1 | 4/2014 | Colinge |
| 2014/0113455 A1 | 4/2014 | Reimer et al. |
| 2014/0151812 A1 | 6/2014 | Liaw |
| 2016/0013104 A1 | 1/2016 | Hung et al. |
| 2017/0103916 A1* | 4/2017 | Jeon ................ H01L 21/823842 |
| 2017/0110554 A1 | 4/2017 | Tak et al. |

\* cited by examiner

SEMICONDUCTOR DEVICE AND METHOD

PRIORITY CLAIM AND CROSS-REFERENCE

This application is a divisional of U.S. patent application Ser. No. 15/394,203, filed on Dec. 29, 2016, entitled "Semiconductor Device and Method," which application claims priority to and the benefit of U.S. Provisional Application No. 62/370,591, filed on Aug. 3, 2016, entitled "Implant Process for Improved FinFET Performance and Resulting Structures," and U.S. Provisional Application No. 62/405,726, filed on Oct. 7, 2016, entitled "Semiconductor Device and Method," which applications are hereby incorporated herein by reference in their entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
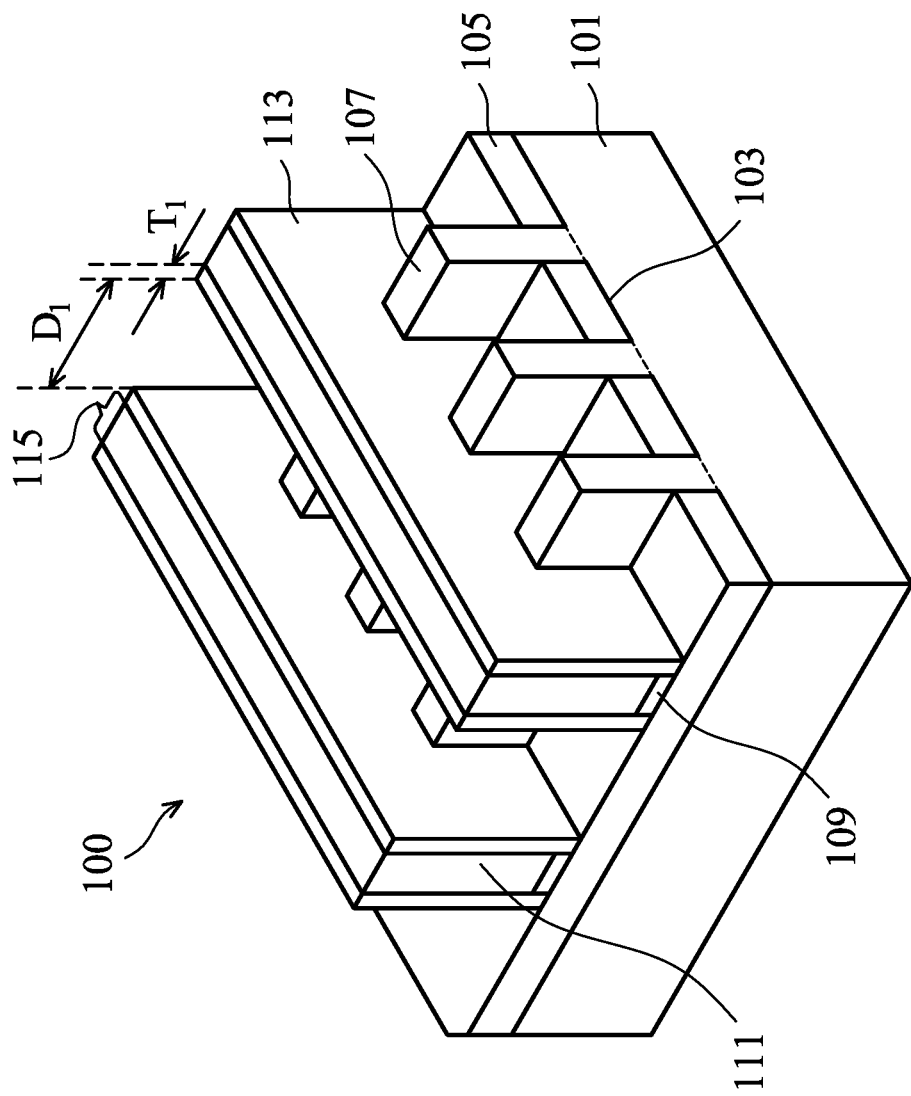
FIG. 1 illustrates steps in a process of forming a finFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a perspective view of a semiconductor device 100 such as a finFET device. In an embodiment the finFET device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a first thickness $T_1$ of between about 5 Å and about 500 Å, such as about 50 Å. Additionally, once the first spacers 113 have been formed, a first spacer 113 adjacent to one stack 115 may be separated from a first spacer 113 adjacent to another stack 115 by a first distance $D_1$ of between about 5 nm and about 200 nm, such as about 20 nm. However, any suitable thicknesses and distances may be utilized.

Figure 2A:
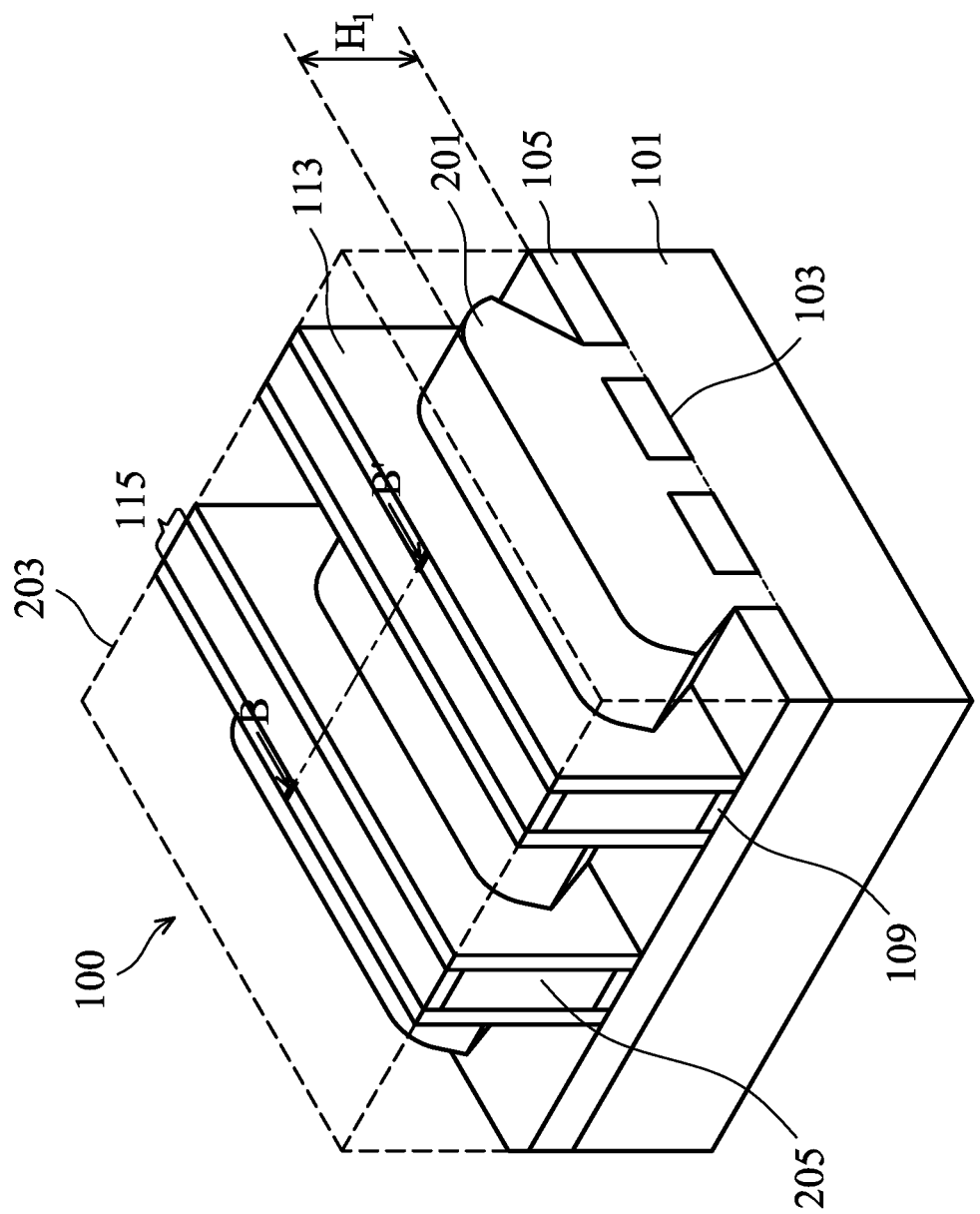
FIGS. 2A-2B illustrate formation of source/drain regions in accordance with some embodiments.
Figure 2B:
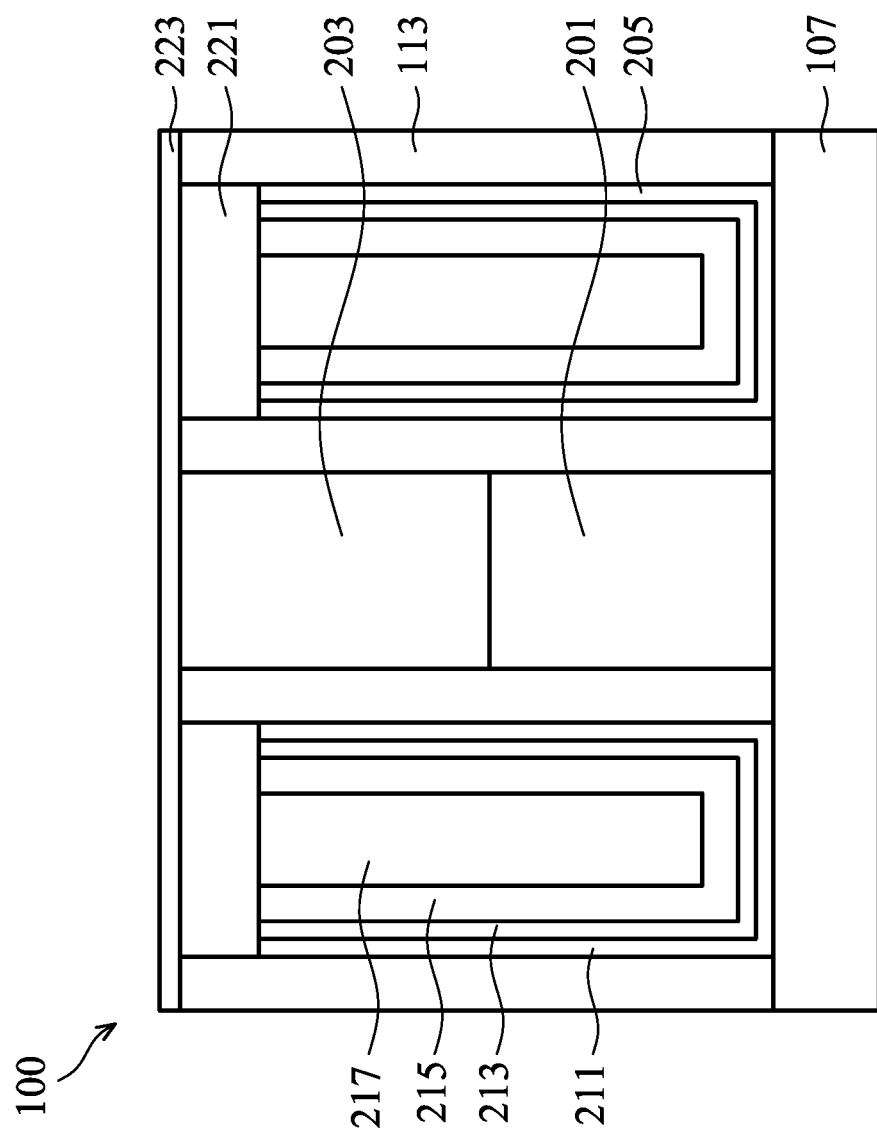

FIGS. 2A-2B illustrate a removal of the fins 107 from those areas not protected by the stacks 115 and the first spacers 113 and a regrowth of source/drain regions 201 (with FIG. 2B illustrating a cross-sectional view of FIG. 2A along line B-B'). The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. In other embodiments the source/drain regions 201 may comprise materials such as GaAs, GaP, GaN, InP, InAs, InSb, GaAsP, AlGaN, AlInAs, AlGaAs, GaInAs, GaInP, GaInAsP, combinations of these, or the like. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 ÅÅ and about 1000 Å, and may have a first height $H_1$ over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2A also illustrates a formation of an inter-layer dielectric (ILD) layer 203 (illustrated in dashed lines in FIG. 2A in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

After the formation of the ILD layer 203, the material of the dummy gate electrode 111 and the dummy gate dielectric 109 may be removed and replaced to form the gate stack 205. In an embodiment the dummy gate electrode 111 may be removed using, e.g., a wet or dry etching process that utilizes etchants that are selective to the material of the dummy gate electrode 111. However, any suitable removal process may be utilized.

Once the dummy gate electrode 111 has been removed, the openings left behind may be refilled to form the gate stack 205. In a particular embodiment the gate stack 205 comprises a first dielectric material 211, a first metal material 213, a second metal material 215, and a third metal material 217. In an embodiment the first dielectric material 211 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 211 may be deposited to a thickness of between about 5 Å and about 200 Å, although any suitable material and thickness may be utilized.

The first metal material 213 may be formed adjacent to the first dielectric material 211 and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 213 may be deposited using a deposition process such as atomic layer deposition, chemical vapor deposition, sputtering, or the like, to a thickness of between about 5 Å and about 200 Å, although any suitable deposition process or thickness may be used.

The second metal material 215 may be formed adjacent to the first metal material 213 and, in a particular embodiment, may be similar to the first metal material 213. For example, the second metal material 215 may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material 215 may be deposited using a deposition process such as atomic layer deposition, chemical vapor deposition, sputtering, or the like, to a thickness of between about 5 Å and about 200 Å, although any suitable deposition process or thickness may be used.

The third metal material 217 fills a remainder of the opening left behind by the removal of the dummy gate electrode 111. In an embodiment the third metal material 217 is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111. In a particular embodiment the third metal material 217 may be deposited to a thickness of between about 5 Å and about 500 Å, although any suitable material, deposition process, and thickness may be utilized.

Once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

After the materials of the gate stack 205 have been formed and planarized, the materials of the gate stack 205 may be recessed and capped with a capping layer 221. In an embodiment the materials of the gate stack 205 may be recessed using, e.g., a wet or dry etching process that utilizes etchants selective to the materials of the gate stack 205. In an embodiment the materials of the gate stack 205 may be recessed a distance of between about 5 nm and about 150 nm, such as about 120 nm. However, any suitable process and distance may be utilized.

Once the materials of the gate stack 205 have been recessed, the capping layer 221 may be deposited and planarized with the first spacers 113. In an embodiment the capping layer 221 is a material such as SiN, SiON, SiCON, SiC, SiOC, combinations of these, or the like, deposited using a deposition process such as atomic layer deposition, chemical vapor deposition, sputtering, or the like. The capping layer 221 may be deposited to a thickness of between about 5 Å and about 200 Å, and then planarized using a planarization process such as chemical mechanical polishing such that the capping layer 221 is planar with the first spacers 113.

FIGS. 2A-2B additionally illustrate a formation of a first etch stop layer 223 over the gate stacks 205. In one embodiment, the first etch stop layer 223 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 223, such as low pressure CVD (LPCVD), PVD, or the like, could alternatively be used. The first etch stop layer 223 may have a second thickness $T_2$ of between about 5 Å and about 200 Å or between about 5 Å and about 50 Å.

FIGS. 2A-2B additionally illustrate a formation of a first etch stop layer 223. In one embodiment, the first etch stop layer 223 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 223, such as low pressure CVD (LPCVD), PVD, or the like, could alternatively be used. The first etch stop layer 223 may have a thickness of between about 5 Å and about 500 Å.

Figure 3:
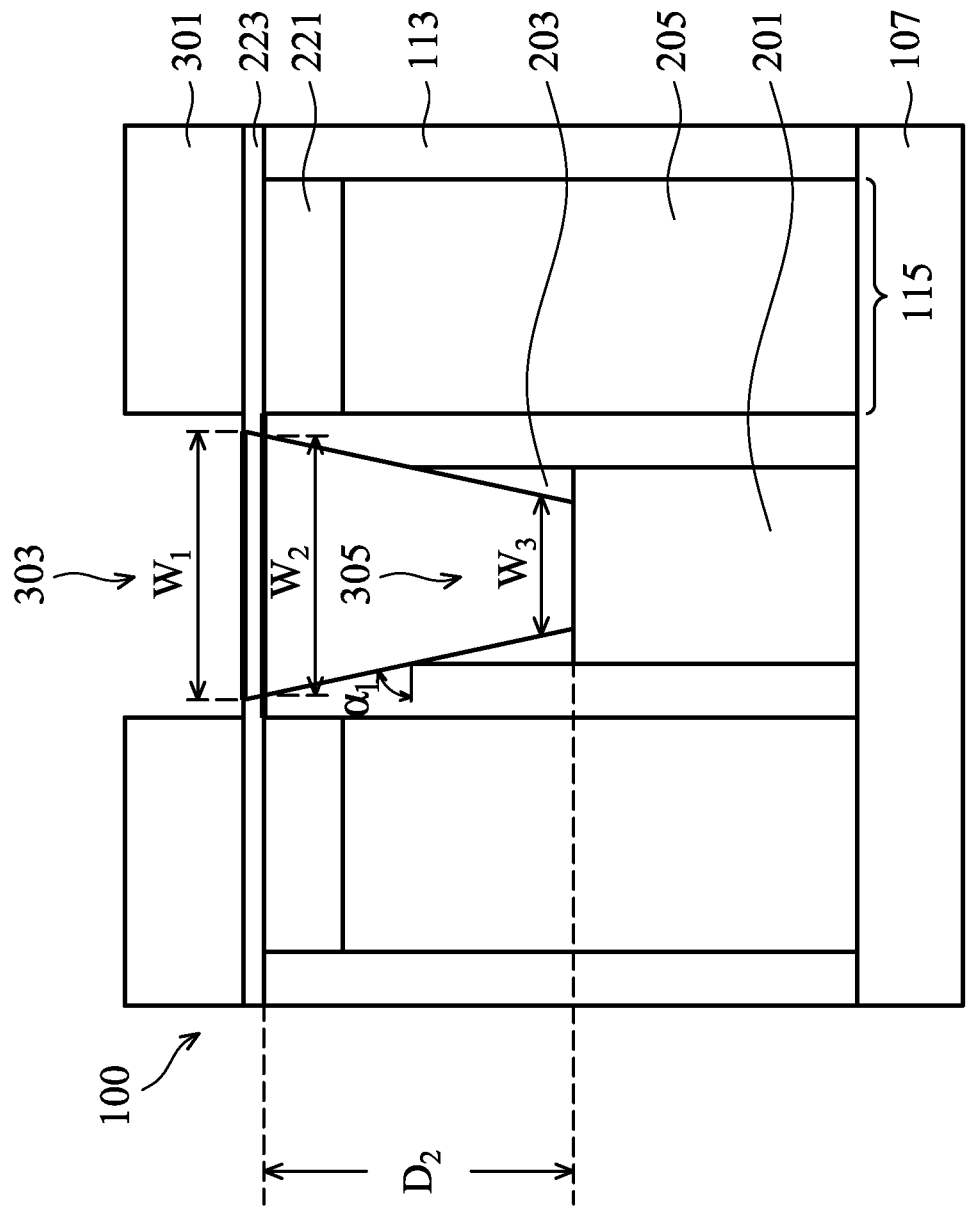
FIG. 3 illustrates a formation of a first opening in accordance with some embodiments.

FIG. 3 illustrates a formation of a first opening 305 through the first etch stop layer 223 and through the ILD layer 203 in order to expose the source/drain regions 201 in preparation for formation of a first contact 501 (not illustrated in FIG. 3 but illustrated and described below with respect to FIG. 4). Additionally, for convenience, the gate stack 205 is illustrated in a simplified form without showing the additional layers. In an embodiment the first opening 305 may be formed by initially placing and patterning a first photoresist 301 over the source/drain regions 201. In an embodiment the first photoresist 301 is a tri-layer photoresist, with a bottom anti-reflective coating (BARC) layer, an intermediate mask layer, and a top photoresist layer (not separately illustrated within FIG. 3). However, any suitable type of photosensitive material or combination of materials may be utilized.

Once the first photoresist 301 has been placed, the first photoresist 301 is patterned. In an embodiment the first photoresist 301 may be patterned by exposing a photosensitive material within the first photoresist 301 (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the first photoresist 301 are different from the physical properties of the unexposed portions of the first photoresist 301. The first photoresist 301 may then be developed with, e.g., a developer (not separately illustrated), in order to separate the exposed portion of the first photoresist 301 from the unexposed portion of the first photoresist 301.

In an embodiment the first photoresist 301 is patterned to form an opening that exposes the first etch stop layer 223. As such, the first photoresist 301 is patterned to form an opening in the first etch stop layer 223 with a first width $W_1$ at the top of the first etch stop layer 223 of between about 3 nm and about 30 nm. However, any suitable width may be utilized.

Once the first photoresist 301 has been patterned, the first opening 305 may be formed using the first photoresist 301 as a mask. In an embodiment the first opening 305 may be formed using a first etching process (represented in FIG. 3 by the wavy line labeled 303), which may be an anisotropic etching process such as a reactive ion etch process. However, any suitable process, such as a wet etching process, and any suitable reactants may be used.

The first etching process 303 may be utilized to form the first opening 305 in preparation for a formation of the first contact 501. In a particular embodiment the first etching process 303 may be utilized to remove the material of the source/drain region 201 to a second distance $D_2$ of between about 5 nm and about 200 nm, such as about 15 nm.

However, any suitable depth may be utilized. Additionally, the first opening 305 at a point adjacent to a top of the first etch stop layer 223 may have the first width $W_1$ (from the first photoresist 301) and may also have a second width $W_2$ at the bottom of the first etch stop layer 223 of between about 10 nm and about 50 nm. Finally, at the bottom of the first opening 305 the first opening 305 may have a third width $W_3$ of between about 8 nm and about 40 nm. However, any suitable dimensions may be utilized.

Additionally, in an embodiment in which the first spacers 113 are silicon nitride and the etchant is $H_2$, $BCl_3$, $SF_6$, $C_4F_8$, $CH_4$, $CH_3F$, $CH_2F_2$, $N_2$, $O_2$, Ar, $Cl_2$, $NF_3$, HBr, $SiCl_4$, combinations of these, or the like, the etchants within the first etching process 303 may also begin to recess the material of the first spacers 113. As such, the first spacers 113 will have sloped sidewalls that are not perpendicular with the substrate 101. In a particular embodiment the first spacers 113 may be sloped at a first angle $\alpha_1$ of between about 10° and about 85°, such as about 65°. For example, the first opening 305 at a point adjacent to a top of the first spacer 113 may have the second width $W_2$ (at the bottom of the first etch stop layer 223). However, any suitable angle and dimensions may be utilized.

Once the first opening 305 has been formed, the first photoresist 301 may be removed. In an embodiment the first photoresist 301 may be removed using, e.g., an ashing process, whereby a temperature of the first photoresist 301 is increased until the first photoresist 301 undergoes a thermal decomposition, at which point the first photoresist 301 may be easily removed. However, any suitable removal process, such as a wet etch, may also be utilized.

Figure 4:
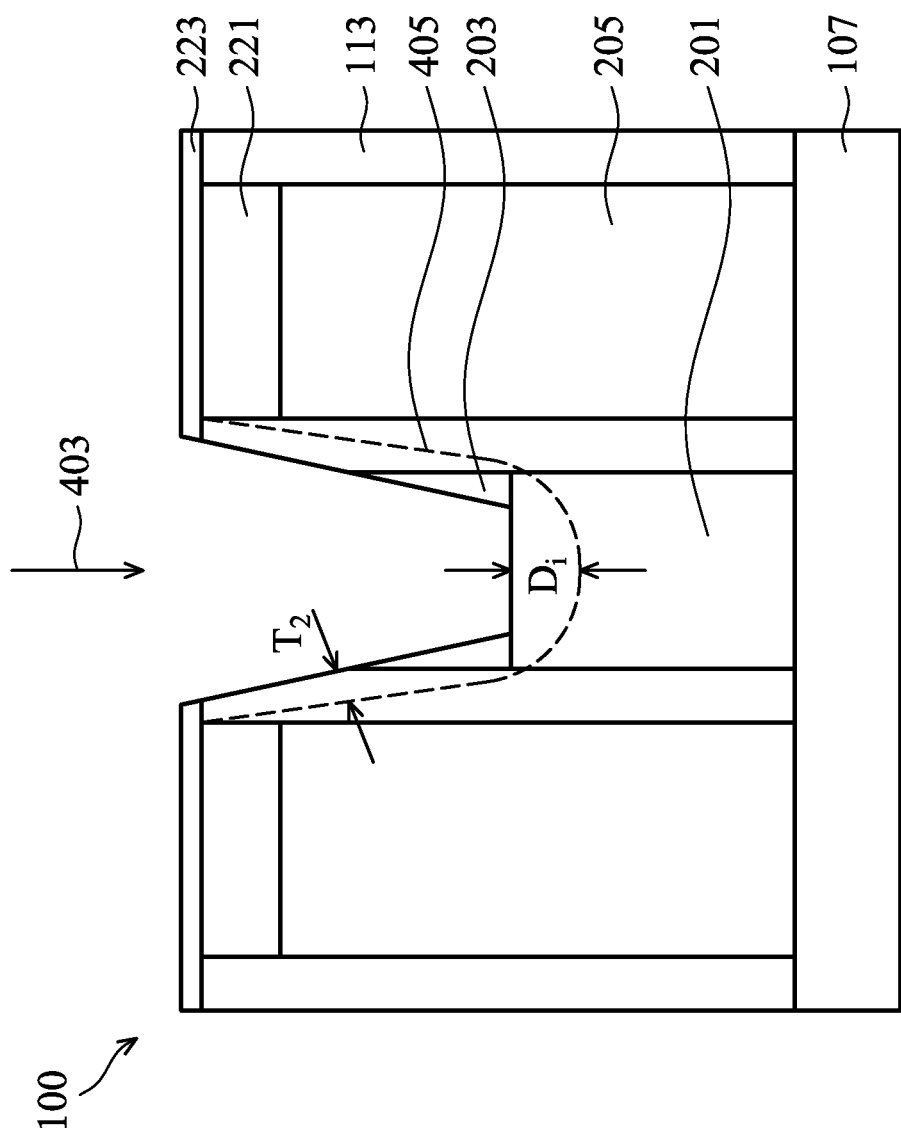
FIG. 4 illustrates an implantation process in accordance with some embodiments.

FIG. 4 illustrates a first implantation (represented in FIG. 4 by the arrow labeled 403) into the source/drain region 201 through the first opening 305. In an embodiment the first implantation 403 is performed in order to implant first dopants into the source/drain region 201. In an embodiment the first dopants may be implanted into the source/drain regions 201 in order to make them conductive or, in an embodiment in which the source/drain regions 201 are already doped, then the first dopants may be implanted into the source/drain regions 201 in order to modify the conductivity of the source/drain regions 201. As such, in an embodiment in which the overall device is an n-type of device, the first dopants may be n-type dopants, such as phosphorous, arsenic, or the like. In another embodiment in which the overall device is a p-type device, the first dopants may be p-type dopants, such as boron, gallium, or the like. Any suitable dopant or combination of dopants may be utilized.

In an embodiment the first dopants may be implanted into the source/drain regions 201 using a process such as a first implantation process, whereby ions of the desired first dopants are accelerated and directed towards the source/drain regions 201. The ion implantation process may utilize an accelerator system to accelerate ions of the desired first dopant at a first dosage concentration. As such, while the precise dosage concentration utilized will depend at least in part on the source/drain regions 201 and the species used, in one embodiment the accelerator system may utilize a dosage concentration of from about $10^{14}$ atoms/cm$^2$ to about $10^{18}$ atoms/cm$^2$ or, for a deeper implantation, up to about $10^{20}$ atoms/cm$^2$. Additionally, the first dopants may be implanted perpendicular to the source/drain regions 201 or else at, e.g., an angle of between about 1° and about 90°, such as about 45°, from perpendicular to the source/drain regions 201.

By implanting the first dopants into the source/drain regions 201, the source/drain regions 201 may be made conductive or else have their conductivity modified by the implanted first dopants. In an embodiment the first dopants may be implanted within the source/drain regions 201 to a concentration of between about $10^{12}$ atom/cm$^2$ and about $10^{16}$ atom/cm$^2$, such as about $10^{15}$ atom/cm$^2$, and after the first implantation 403, the source/drain regions 201 may have a total concentration of dopants (including the original implantation as well as the first dopants from the first implantation 403) of between about $10^{16}$ atom/cm$^2$ and about $10^{20}$ atom/cm$^2$, such as about $10^{17}$ atom/cm$^2$. However any suitable concentration may alternatively be utilized. The first implantation region 405 within the source/drain regions 201 may have an implantation depth $D_i$ of between about 5 Å and about 1000 Å, although any suitable depth may be utilized.

Additionally, instead of simply implanting into the source/drain regions 201, the first implantation 403 will implant the first dopants directly into the sloped sidewalls of the first spacers 113 instead of the first dopants being implanted through an indirect process such as through diffusion. The direct implantation of the first implantation 403 forms a first implantation region 405 within the first spacers 113 and along sides of the first spacers 113 exposed by the source/drain regions 201.

In an embodiment the first implantation region 405 will have a second thickness $T_2$ within the first spacers 113 of between about 5 Å and about 50 Å, such as about 15 Å. Additionally, within the first spacers 113 the first implantation region 405 may have a concentration of the first dopants of between about $10^{12}$ atom/cm$^2$ and about $10^{16}$ atom/cm$^2$, such as about $10^{15}$ atom/cm$^2$. However, any suitable thickness and concentration may be utilized.

In a particular embodiment, a ratio of the first width $W_1$ to the second width $W_2$ may be greater than 1, while a ratio of the second width $W_2$ to the third width $W_3$ may also be greater than 1. Similarly, a ratio of the second thickness $T_2$ to the first width $W_1$ may be less than 1 while a ratio of the second thickness $T_2$ to the second width $W_2$ is also less than 1. Finally, the first width $W_1$ may be greater than the second width $W_2$, the second width $W_2$ may be greater than the third width $W_3$, and the third width $W_3$ may be greater than the second thickness $T_2$. However, any suitable dimensions may be utilized.

Additionally, the first implantation 403 will not just implant the first dopants into the first spacers 113 and the source/drain region 201. In particular, the first implantation 403 will also implant the first dopants into the first etch stop layer 223, which serves as a mask in order to prevent the first implantation 403 from implanting the first dopants into undesired regions.

After the first implantation 403 the first dopants may be activated. In an embodiment the first dopants may be activated using, e.g., a thermal annealing process. In an embodiment the anneal may be performed at a temperature of between about 50° C. and about 600° C., such as about 150° C. and for a time of between about 5 seconds and about 200 seconds, such as about 15 seconds. However, any suitable temperature and time may be utilized.

Figure 5:
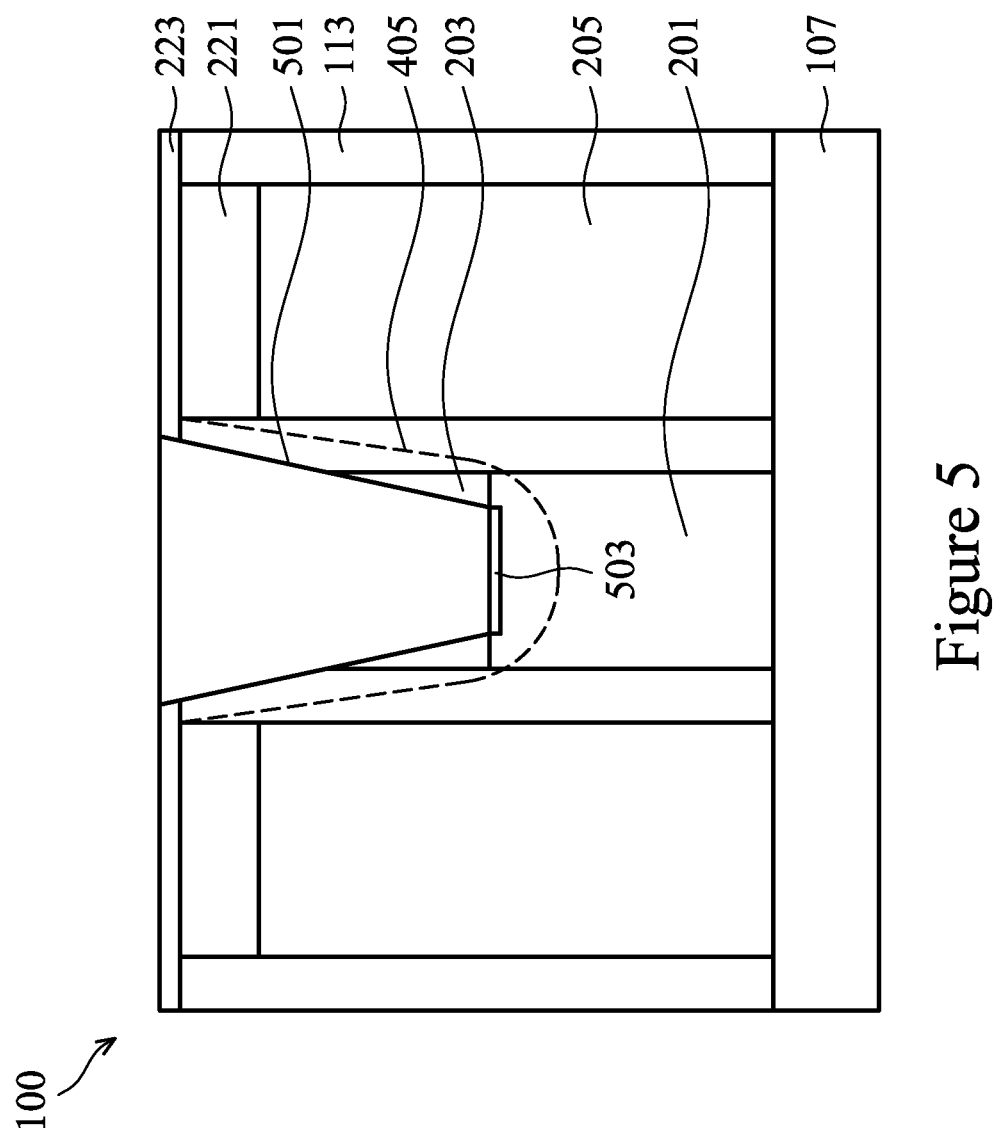
FIG. 5 illustrates a formation of a first contact in accordance with some embodiments.

FIG. 5 illustrates a formation of the first contact 501. Optionally, a silicide contact 503 may be formed from the upper surface of the source/drain region 201 prior to formation of the first contact 501. The silicide contact 503 may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contact 503 may be between about 5 Å and about 2000 Å.

Once the silicide contact 503 has been formed, the first contact 501 is formed. In an embodiment the first contact 501 may be a conductive material such as Al, Cu, W, Co, Ti, Ta, Ru, TiN, TiAl, TiAlN, TaN, TaC, NiSi, CoSi, alloys of these, combinations of these, or the like, and may be deposited using a deposition process such as sputtering, chemical vapor deposition, electroplating, electroless plating, or the like, to fill and/or overfill the first opening 305. Once filled or overfilled, any deposited material outside of the first opening 305 may be removed using a planarization process such as chemical mechanical polishing (CMP). However, any suitable material and process of formation may be utilized.

Once the first contact 501 has been formed, the finFET device 100 is ready for additional processing. In some embodiments the additional processing may include forming one or more metallization layers over the first contact 501 in order to form functional circuitry, forming contact pads in electrically connection with the metallization layer, and packaging the finFET device 100 so that the finFET device 100 may be attached to other external devices.

By utilizing the first implantation 403 to implant the first dopants into the source/drain regions 201 as well as the first spacers 113, the first implantation 403 can be used to stabilize the implantation conditions, leading to better drain induced barrier loading (DIBL) and Ion-Ioff. Such improvements help devices pass the wafer acceptance tests (WAT). Additionally, processes used to manufacture these devices have an enlarged MP and MD process window. Finally, devices made through these processes have a better device uniformity performance.

Figure 6A:
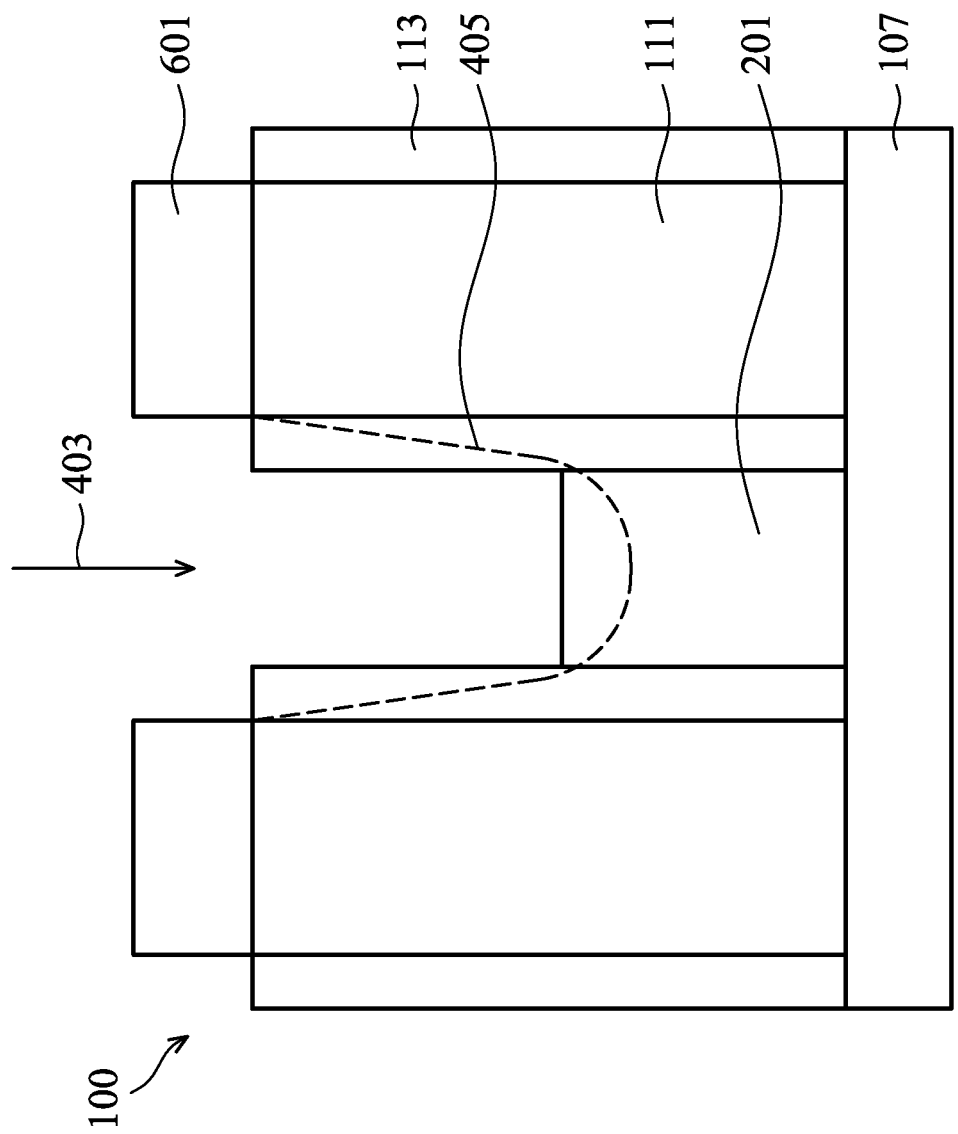
FIGS. 6A-6B illustrate an implantation prior to formation of an inter-layer dielectric in accordance with some embodiments.
Figure 6B:
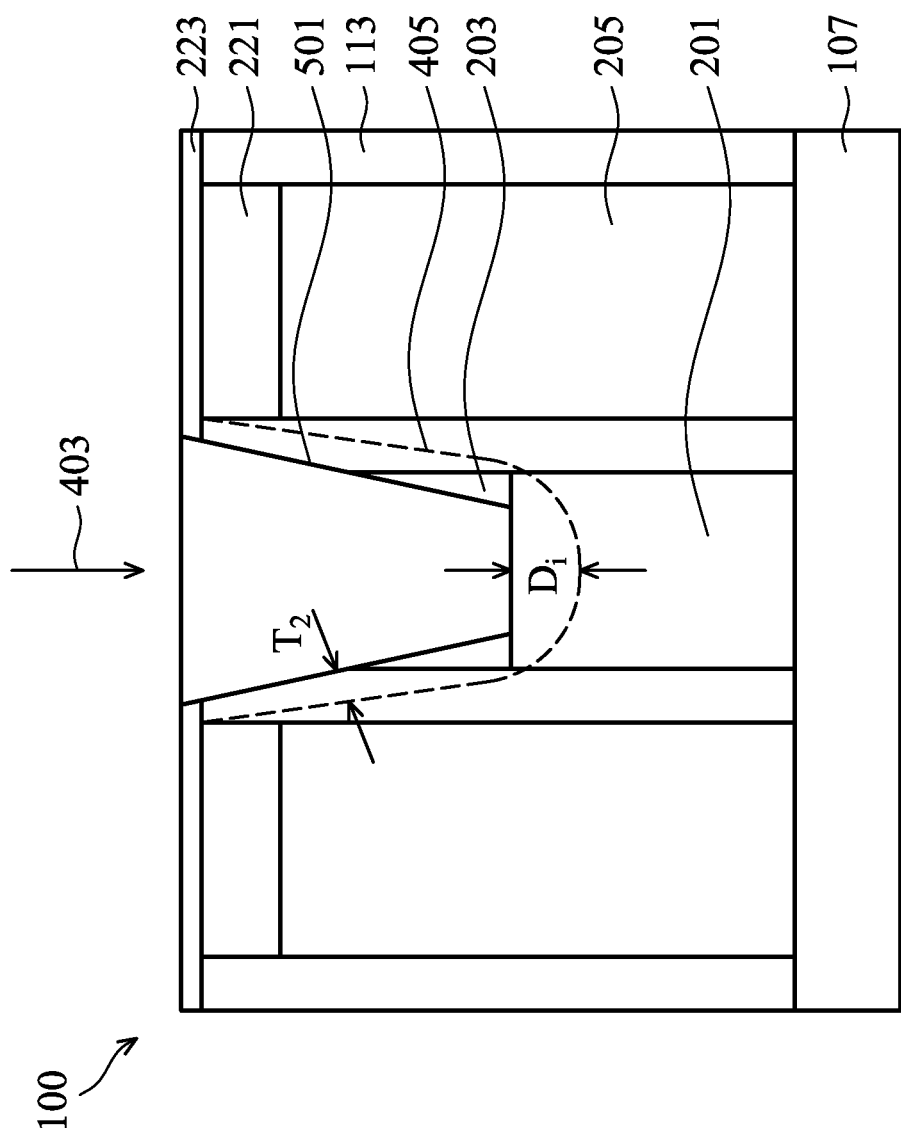

FIGS. 6A-6B illustrate another embodiment in which the first implantation 403 is performed prior to formation of the ILD layer 203. Looking first at FIG. 6A, in this embodiment the first implantation 403 is performed after the regrowth of the source/drain regions 201 and prior to the deposition of the ILD layer 203. Additionally in FIG. 6A, the hardmask 601 that was previously not illustrated in FIG. 1 has been added for clarity.

In this embodiment, once the source/drain regions 201 have been grown and are still exposed, the first implantation 403 is performed at this time in order to implant the first dopants into both the first source/drain regions 201 as well as the first spacers 113. In an embodiment the first implantation 403 is performed as described above with respect to FIG. 4, although in other embodiments it may be different. Similarly, the first implantation 403 creates the first implantation region 405 within the first spacers 113 as well as the first source/drain regions 201, but will not implant the first dopants into the ILD layer 203 or the first etch stop layer 223 because the ILD layer 203 and the first etch stop layer 223 have not yet been formed.

FIG. 6B illustrates the continuation of the process from FIG. 6A as described above with respect to FIGS. 2A-5 (but without a repetition of the first implantation 403). For example, the ILD layer 203 is formed, the dummy gate electrode 111 is replaced with the gate stack 205, and the first contact 501 is formed. However, in this embodiment the ILD layer 203 is either completely free (or almost completely free because of some minor diffusion) from the first dopants implanted during the first implantation 403.

Figure 7:
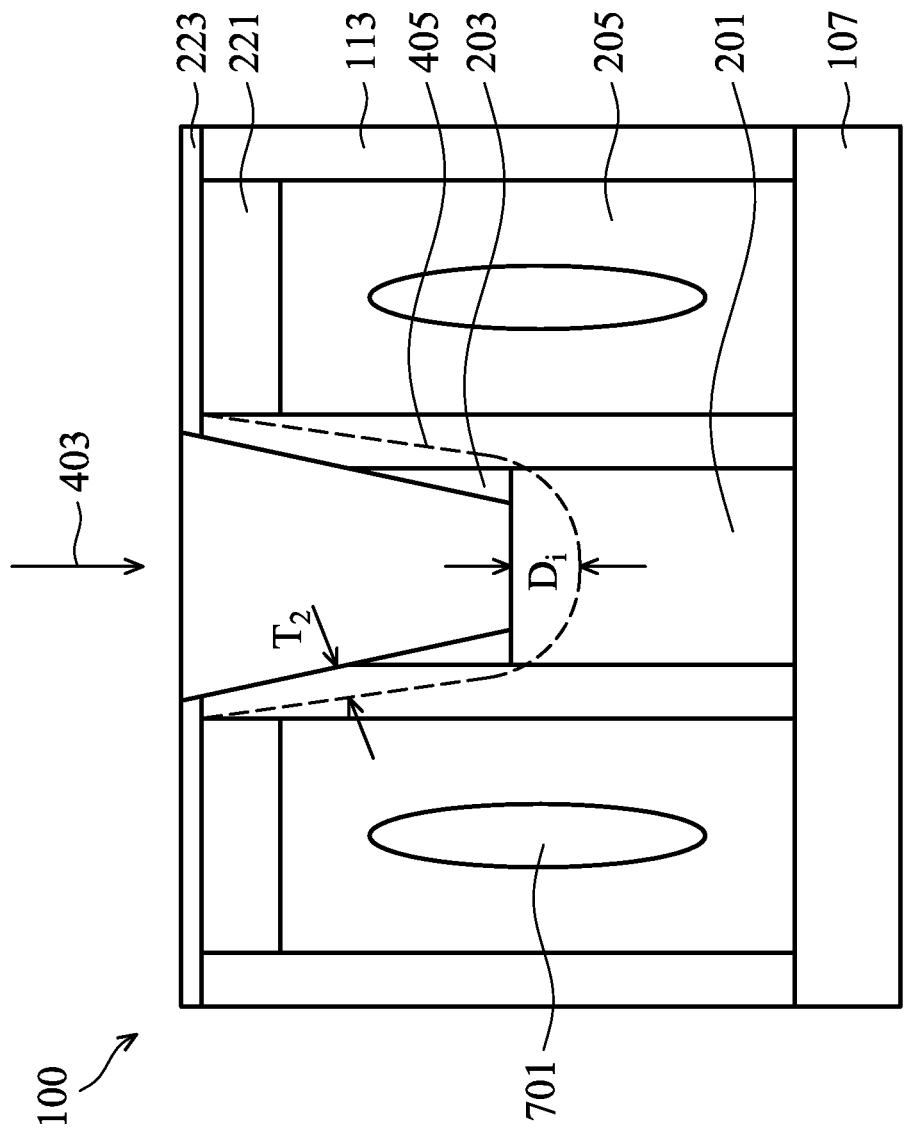
FIG. 7 illustrates a formation of a seam in accordance with some embodiments.

FIG. 7 illustrates another embodiment in which the gate stack 205 comprises a seam 701 or void within the material of the third metal material 217 within the gate stack 205. The seam 701 is formed during the deposition process for the third metal material 217 when the gate width is small for a short-channel device and a non-conformal deposition process is utilized. In a particular embodiment to obtain the formation of the seam 701, a non-conformal deposition process such as chemical vapor deposition or physical vapor deposition is utilized on a device wherein the gate width is equal to or less than 15 nm.

In accordance with an embodiment, a method of manufacturing a semiconductor device comprises manufacturing a first source/drain region adjacent to a first spacer, the first spacer adjacent to a gate electrode. An opening is formed exposing the first source/drain region, and dopants are implanted into the source/drain region and the first spacer after the forming the opening, wherein the implanting the dopants forms a first implantation region within the first spacer.

In accordance with another embodiment, a method of manufacturing a semiconductor device comprises forming a gate stack over a semiconductor fin, the gate stack comprising a gate electrode. A first spacer is formed over the semiconductor fin and adjacent to the gate stack, and a portion of the semiconductor fin exposed by the first spacer is removed. A source/drain region is regrown, and an opening is formed to expose a portion of the source/drain region. An implantation mask is formed over the gate stack, wherein the portion of the source/drain region exposed by the opening remains exposed after the forming the implantation mask, and first dopants are directly implanted into both the source/drain region and the first spacer.

In accordance with yet another embodiment, a semiconductor device comprises a first spacer adjacent to a gate electrode over a substrate, the first spacer having a first sidewall facing away from the gate electrode, the first sidewall comprising a first straight portion adjacent to the substrate and a second straight portion adjacent to the first straight portion, wherein the second straight portion extends away from the substrate at a different angle than the first straight portion. A first implantation region is along the first sidewall in the second straight portion. A source/drain region is adjacent to the first straight portion, and a first contact in electrical connection with the source/drain region and extending at least partially over the first spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first source/drain region adjacent to a first spacer, the first spacer adjacent to a gate electrode, the first spacer comprising a first portion with a constant width and a second portion with a width that gets smaller as the second portion extends away from the first source/drain region;

a first conductive plug adjacent to the first spacer and in physical contact with the first source/drain region;

a first implantation region of first dopants extending from within the first spacer to within the first source/drain region, wherein the first conductive plug is free from the first dopants; and a dielectric material located between the first conductive plug and the first spacer.

2. The semiconductor device of claim 1, wherein the first implantation region has a thickness of between about 5 Å and about 50 Å within the first spacer.

3. The semiconductor device of claim 2, wherein the first implantation region has a thickness of between about 5 Å and about 1000 Å within the first source/drain region.

4. The semiconductor device of claim 1, wherein the first conductive plug has a first thickness adjacent to the first source/drain region and a second thickness larger than the first thickness.

5. The semiconductor device of claim 1, wherein the first conductive plug comprises a silicide region.

6. The semiconductor device of claim 1, wherein the first spacer comprises silicon nitride.

7. A semiconductor device comprising:
a gate stack overlying a semiconductor fin over a substrate, the gate stack comprising a capping layer;
a spacer adjacent to the gate stack, the spacer having a first external sidewall and a second external sidewall intersecting the first external sidewall, the second external sidewall having a different angle from the substrate than the first external sidewall, the first external sidewall and the second external sidewall each facing away from the gate stack and being straight;
a source/drain region adjacent to the spacer;
an implantation region located within both the spacer and the source/drain region; and
a conductive plug in physical contact with both the source/drain region and the second external sidewall, the conductive plug being physically separated from the capping layer.

8. The semiconductor device of claim 7, further comprising a first dielectric material located between the conductive plug and the first external sidewall.

9. The semiconductor device of claim 7, wherein the conductive plug comprises a silicide region.

10. The semiconductor device of claim 7, wherein the second external sidewall has an angle from the substrate of between about 15° and about 85°.

11. The semiconductor device of claim 7, wherein the conductive plug has a first thickness adjacent to the source/drain region and a second thickness greater than the first thickness adjacent to the second external sidewall.

12. The semiconductor device of claim 11, wherein the first thickness is between about 8 nm and about 40 nm.

13. The semiconductor device of claim 12, wherein the second thickness is between about 10 nm and about 50 nm.

14. A semiconductor device comprising:
a first spacer adjacent to a gate electrode over a substrate, the first spacer having a first sidewall facing away from the gate electrode, the first sidewall comprising:
a first straight portion adjacent to the substrate, the first straight portion facing away from the gate electrode; and
a second straight portion adjacent to the first straight portion, wherein the second straight portion extends away from the substrate at a different angle than the first straight portion, the second straight portion facing away from the gate electrode;
a first implantation region along the first sidewall in the second straight portion;
a source/drain region adjacent to the first straight portion;
a first contact in electrical connection with the source/drain region and extending at least partially over the first spacer; and
a dielectric material located between the first contact and at least a portion of the second straight portion.

15. The semiconductor device of claim 14, further comprising first dopants located within both the first implantation region and the source/drain region.

16. The semiconductor device of claim 14, wherein the first spacer comprises silicon nitride.

17. The semiconductor device of claim 14, wherein the second straight portion extends away from the substrate at an angle of between about 15° and about 85°.

18. The semiconductor device of claim 14, wherein the first contact comprises tungsten.

19. The semiconductor device of claim 1, further comprising a capping layer over the gate electrode, the capping layer being physically separated from the first conductive plug.

20. The semiconductor device of claim 14, further comprising a capping material in physical contact with the gate electrode, the first contact being separated from the capping material by the first spacer.

* * * * *